United States Patent [19]

Sokolovsky

[11] Patent Number: 4,691,747

[45] Date of Patent: Sep. 8, 1987

[54] CONTROLLED DEFORMATION ALIGNMENT METHOD AND APPARATUS

[75] Inventor: Paul J. Sokolovsky, Sunnyvale, Calif.

[73] Assignee: Advanced Micro Devices, Inc., Sunnyvale, Calif.

[21] Appl. No.: 844,922

[22] Filed: Mar. 27, 1986

[51] Int. Cl.[4] .............................................. B21F 1/02
[52] U.S. Cl. .................................................. 140/147
[58] Field of Search ................................ 140/147, 105

[56] References Cited

U.S. PATENT DOCUMENTS

| | | | |
|---|---|---|---|
| 3,664,016 | 5/1972 | Sevc et al. | 140/147 |
| 3,730,234 | 5/1973 | Hesselmann | 140/147 |
| 4,002,191 | 1/1977 | Lorenzini | 140/147 |
| 4,397,341 | 8/1983 | Kent | 140/147 |
| 4,510,686 | 4/1985 | Foster | 140/147 |
| 4,544,003 | 10/1985 | Bumann | 140/147 |

Primary Examiner—Lowell A. Larson
Attorney, Agent, or Firm—Patrick T. King; Eugene Valet; Davis Chin

[57] ABSTRACT

A method and apparatus for aligning projecting parts of an assembly, such as integrated circuit electrical connector pins. A deformation plate at a first deformation station of the apparatus deforms the pins in a first vector direction, e.g., radially outward. At a second deformation station, the apparatus deforms the pins in a second vector direction, e.g., radially inward. The method causes the pins to be aligned to a very narrow tolerance.

4 Claims, 7 Drawing Figures

CONTROLLED DEFORMATION ALIGNMENT METHOD AND APPARATUS

BACKGROUND OF THE INVENTION

1. Field of the Invention

The present invention generally relates to devices for configuring physical projections. More particularly, the present invention relates to a method and apparatus which is especially useful for straightening an array of pins such as the numerous electrical connection pins on an integrated circuit mounting package.

2. Description of the Related Art

Electrical connectors generally comprise a plug, having a plurality of connector pins, and a jack, having a matching number of sockets, for mating with the plug. From the simple two or three-pronged household plug to multipinned computer connectors, most coupling arrangements suffer from the same problem: if one or more of the pins are not aligned to a specific tolerance, proper mating cannot be achieved. An attempt at mating a plug with a bent pin results not only in a faulty electrical connection, but often in irreparable damage to the plug. Generally, this tolerance is defined by the planar alignment and relative oversize of the sockets with respect to the pins.

The problem increases in complexity with the increase in the number, the increase in density, and the decrease in size of the pins.

For example, for integrated circuit (IC) devices, several different types of mounting packages exist in today's technology. A commonly used dual-in-line (DIP) IC mounting package 2 is shown in FIG. 1 (magnified to a scale of approximately 1.5 actual size). Twenty-eight electrical connector pins 4 project from the base 6 of the package 2. Insertion of this type of package 2 into a plug poses little problem. Proper mating of the pins and sockets can be visually verified. However, if insertion is done by robotics, a bent pin 4 could cause problems.

Shown in FIG. 2 is a typical IC mounting package 3 for a gate array integrated circuit (also magnified by approximately 1.5 times actual size). Because of the nature of the circuitry involved, there are 144 pins 4 protruding from the base 6 of this exemplary package 3. When inserting this type of package 3 into a plug, verification of proper alignment of the pins 4 and their mating sockets is obviously a much more difficult task.

With a package such as shown in FIG. 1, realignment of a bent pin 4 may be possible as long as the internal electrical coupling of the IC to the bent pin was not broken during a misaligned mating attempt. However, because of the size and arrangement of the pins 4 on the package 3 of FIG. 2, a bent-pin misaligned insertion into a socket would most likely form an electrical short to an adjacent pin. Activation of the IC would most likely result in irreparable damage to the circuitry. Even if the circuitry remained undamaged, because of the more fragile nature of this type of pin, a later attempt to mechanically straighten the offending pin usually will result in its breaking off. Moreover, because of the pin density on this type of package 3, the very same attempt at straightening one pin could result in the bending out of tolerance of adjacent pins.

One known method and apparatus for straightening IC pins is a model 1060 sold under the trademark LEADSTAR and manufactured by Alpha Modular Systems, Oceanside, Calif. In this system, the pins are combed and vibrated to a tolerance of approximately the width of one pin. For a very dense pin configuration, such a tolerance may be inadequate.

Hence, there is a need for a method and apparatus for straightening an array of pins to a predetermined specific alignment tolerance.

SUMMARY OF THE INVENTION

It is an object of the present invention to provide a method for setting all of the pins in an array of pins to a predetermined configuration.

It is another object of the present invention to provide a method for straightening all of the pins in an array to a predetermined alignment tolerance.

It is a further object of the present invention to provide an apparatus which will simultaneously bend all of the pins in an array of pins to a predetermined configuration.

It is yet another object of the present invention to provide an apparatus for straightening all of the pins in an array of pins to a predetermined alignment tolerance.

It is still a further object of the present invention to provide an effective method and apparatus to straighten the pins on a gate array IC package.

In a broad aspect, the present invention is an apparatus for conforming a plurality of projecting parts mounted to a surface of an assembly to a predetermined configuration. A holder, such as a slotted turntable, fastens the assembly in a certain position. A floatingly-mounted deformation plate, having tapered apertures in a substantially planar surface, is moved into substantial abutment with the assembly surface such that the projecting parts mate with the apertures. In the preferred embodiment a first deformation plate deforms the projecting parts to a wide tolerance, and a second deformation plate then deforms the projecting parts to a narrower tolerance, viz., a configuration which will ensure proper mating of the assembly into a complementary socket.

In another broad aspect, the present invention is a method for setting a plurality of projecting parts mounted to a substantially planar surface of an assembly to a predetermined configuration. Each of the projecting parts is simultaneously deformed to a first configuration of a relatively wide tolerance with respect to socket dimensions to which the projecting parts must ultimately mate. Then, each of the projecting parts is simultaneously deformed to a second configuration of a narrow such tolerance. This second deformation also compensates for any spring-back out of tolerance which may have occurred after the first deformation.

Other objects, features, and advantages of the present invention will become apparent upon consideration of the following detailed description and the accompanying drawings of a preferred embodiment, in which like reference designations represent like features throughout the FIGURES.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable. The preferred embodiment is described as an apparatus used for straightening the pins of a mounting package 3 for a gate array IC. This description is for illustration and should not be construed as a limitation on the applicability of the present invention.

Figure 3:
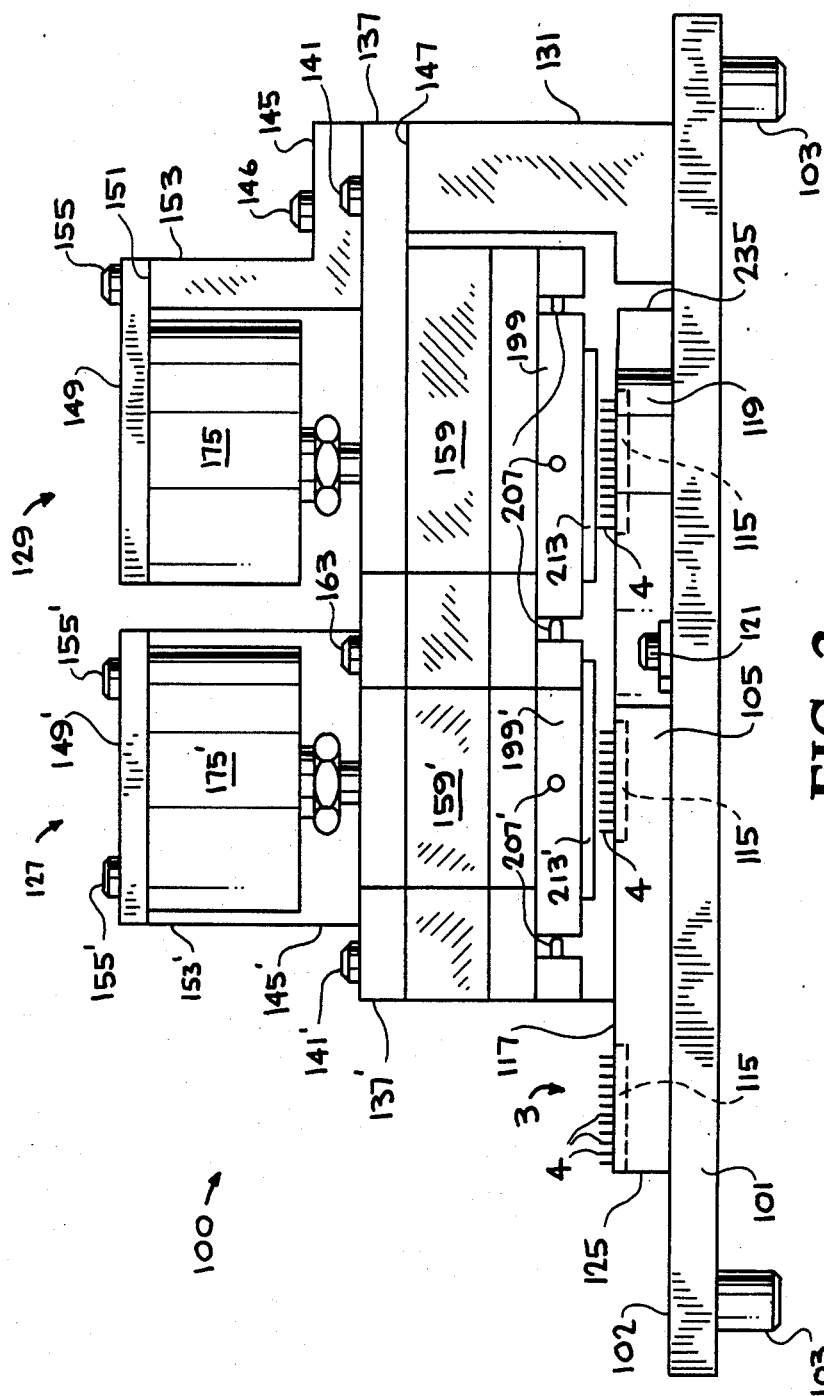
FIG. 3 is a plan view (side) of a preferred embodiment of the apparatus of the present invention.
Figure 4:
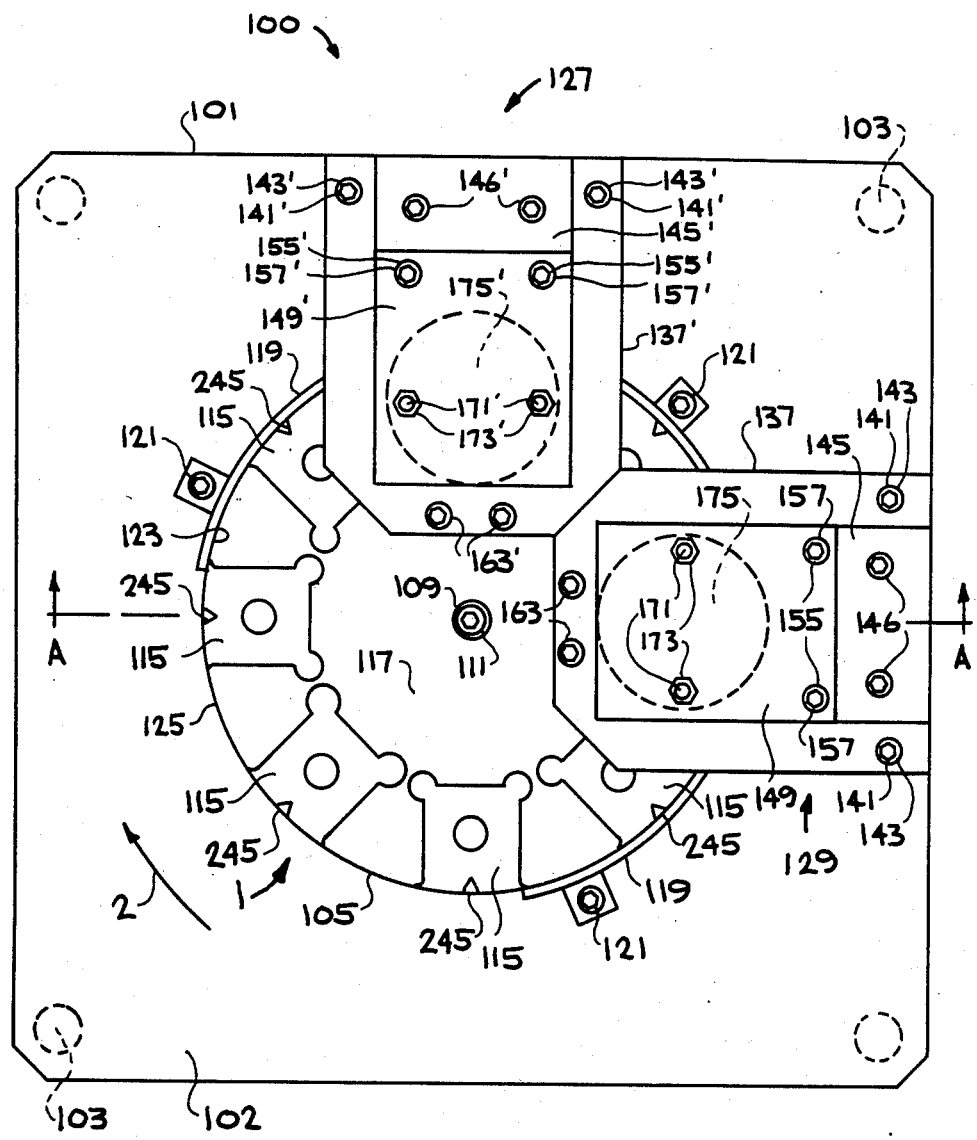
FIG. 4 is a plan view (top) of the present invention as shown in FIG. 3.
Figure 5:
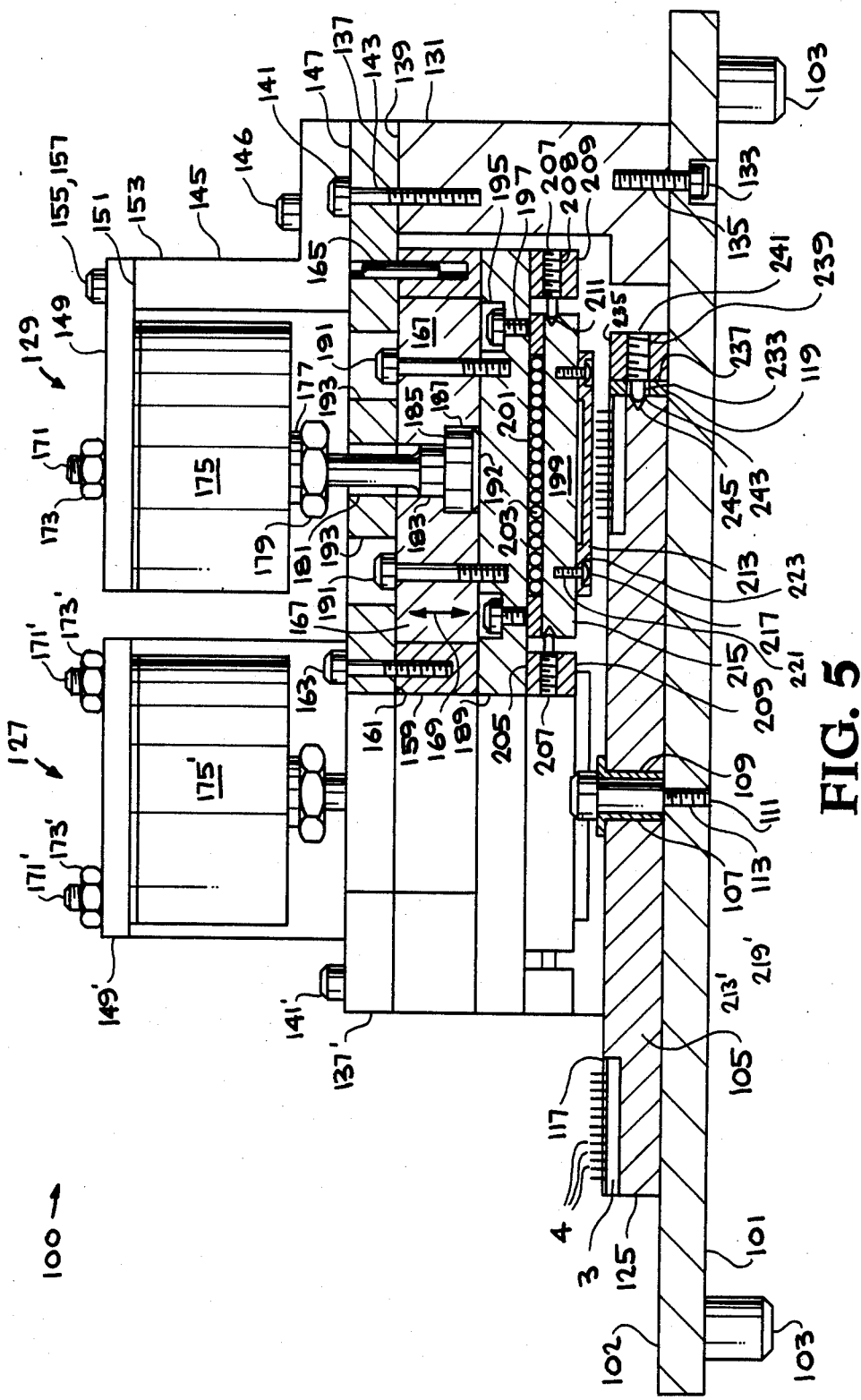
FIG. 5 is a cut-away plan view (side) taken in plane A—A, as shown in FIG. 4, of the present invention as shown in FIG. 3.

Referring to FIGS. 3 through 5, a base member 101 having integral or mounted feet 103 provides a general platform for the IC pin-straightening apparatus 100. Rotatively mounted on a surface 102 of the platform is a turntable 105. The mounting for the turntable 105 is a simple spindle device, such as center hole 107 in the turntable 105, having a shouldered thrust washer 109 for receiving a cotter 111 which extends into an alignment hole 113 in the base 101.

Figure 1:
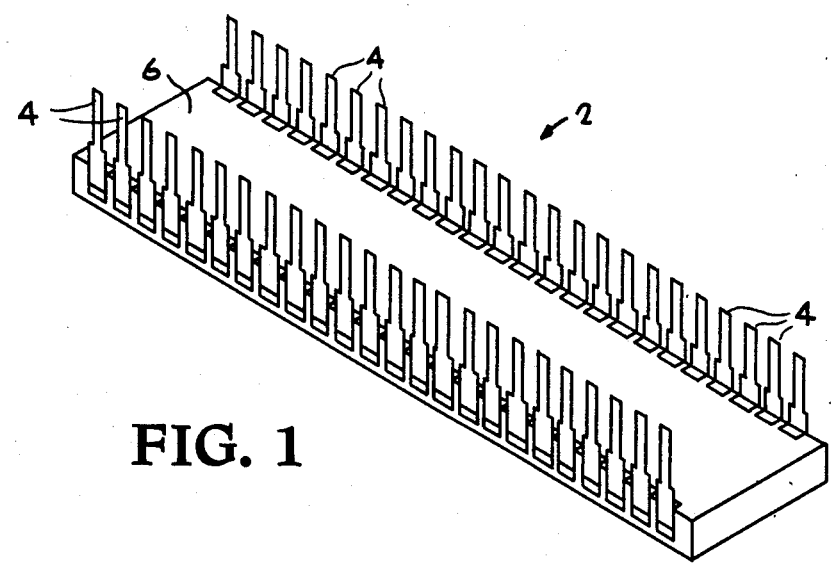
FIG. 1 is a perspective view depicting the bottom of a typical IC mounting package of the DIP type.
Figure 2:
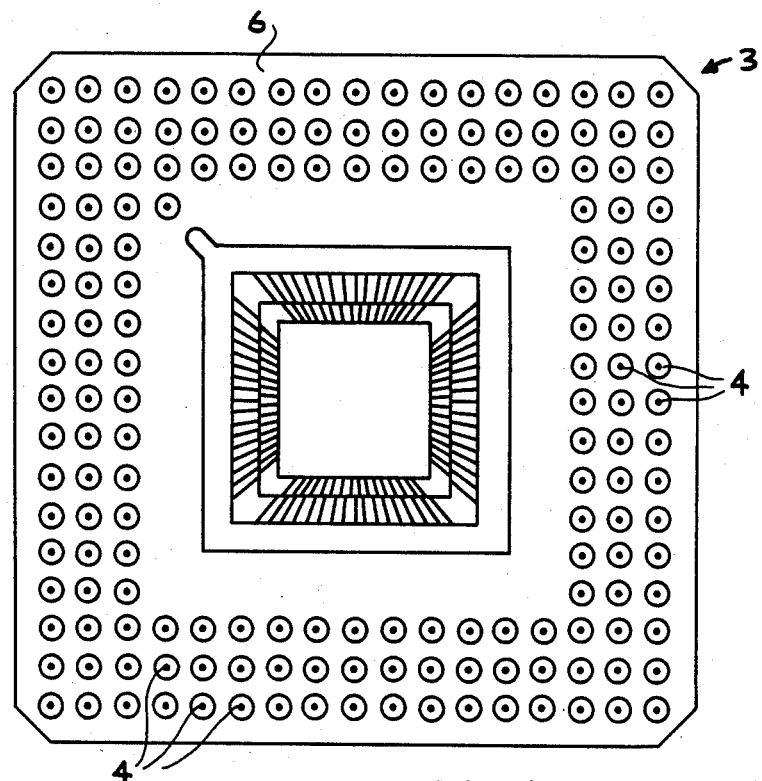
FIG. 2 is a perspective view depicting the bottom of a typical mounting package for a gate array IC type.

Along the periphery of the turntable 105 are a series of radially-aligned depressions 115 cut in the shape of a mounting package 3, such as shown in FIG. 2. As shown in FIG. 5, an IC package 3 is held fixed within one of the depressions 115 with its pins 4 in a plane which is substantially perpendicular to the top surface 117 of the turntable 105. Further, the depression 115 has a depth dimension such that substantially the entire length of the pins 4 project above the surface 117 of the turntable 105. As also shown, in FIG. 5, the depression 115 is also dimensioned such that the package 3 is radially positioned completely within the circumference of the turntable 105.

Referring to FIG. 4, a shoulder piece 119 is fastened to the platform surface 102 by any suitable fastening device 121. The shoulder piece 119 extends around approximately three-quarters of the circumference of the turntable 105 and has an inner wall 123 slidingly abutting the outer rim 125 of the turntable 105. The height of the shoulder piece 119 is slightly greater than the height of the turntable surface 117 above the platform surface 102. Hence, the shoulder piece 119 and inner wall 123 functions as an outer wall for depressions 115 during three-quarters of a full rotation.

A first deformation plate controlling mechanism 127 for aligning the pins 4 to a first configuration of a predetermined alignment tolerance is virtually identical to a second plate controlling mechanism 129. As best viewed in FIG. 4, each are orthogonally located on platform surface 102. In this configuration, the two mechanisms 127, 129 form a first and second station, respectively, for alignment with packages 3 in said depressions 115 along the periphery of turntable 105 at locations on the platform where the shoulder piece 119 is serving its above-said function.

Since the two mechanisms 127, 129 are identical, a detailed description of the preferred embodiment of only one, 129, as shown in cut-away cross-sectional view in FIG. 5, will be necessary for a complete understanding of the general construction.

A first mounting L-bracket 131 is fastened to the surface 102 of base 101, such as with bolts 133 extending through holes 135 in the base 101.

A first, fixed-position plate 137, extending inward from the periphery of the base 101 and over the turntable 105 a distance of less than the radius of the turntable 105, is fastened to the top 139 of the L-bracket 131, such as with bolts 141 (extending through holes 143' in the plate 137' and into the first L-bracket 131', as depicted only for mechanism 127). The mounting bracket 131 thus provides vertical support to this plate 137 which is used to mount the deformation plate carrier described hereinafter.

A second mounting L-bracket 145 is fastened, such as with bolts 146, to the top surface 147 of the first plate 137 to provide vertical support inwardly from the periphery of the base 101 above the first plate 137.

A second, fixed-position plate 149, extending inwardly from the periphery of the base 101 and over the turntable 105 approximately the same distance as the first plate 137, is fastened to the top 151 of the upper extremity 153 of the second L-bracket 145, such as with bolts 155 extending through holes 157 in said second plate 149 and into the upper extremity 153 of the second L-bracket 145. The second L-bracket 145 thus provides vertical support to the second plate 149, which is used to mount a mechanism to transport the deformation plate carrier, also described hereinafter.

As explained earlier, the first plate 137 is used to support a deformation plate carrier. The carrier has a fixed-position, upper mounting plate 159 fixedly attached to the bottom surface 161 of the first mounting plate 137, such as with bolts 163 and dowel pins 165. This upper mounting plate 159 has a central aperture. A second upper mounting plate 167 fits slidingly within the aperture.

The mechanism for transporting the second upper mounting plate 167 in a vertical vector direction (indicated by arrow 169), with respect to the upper mounting plate 159, is attached to the second, fixed-position plate 149, such as with a bolt 171 and nut 173 arrangement. In the preferred embodiment, the mechanism is an air cylinder device 175 having a piston 177 extending downward through sleeve 179. The piston 177 passes freely through an aperture 181 in the first, fixed-position plate 137 and a subjacent aperture 183 in the second upper mounting plate 167. At the lowest extremity 185 of the piston 177, there is a piston head 187.

A lower mounting plate 189 is fastened to the second upper mounting plate 167, such as with bolts 191. Note that in the present embodiment, apertures 193 in the first mounting plate 137 prevent the bolt 191 heads from limiting the upward motion of the second upper mounting plate 167 with respect to the first mounting plate 137. The piston head 187 is fixed to the top surface 193 at the lower mounting plate 189.

Lower mounting plate 189 functions to hold a deformation plate assembly to the transport mechanism, whereby the deformation plate assembly is self-aligning. Oversized apertures 195 in the lower mounting plate 189 allow loosely fit shoulder screws 197 to hold a deformation plate mount 199 in a position over the turntable 105. A central recess in the top surface 201 of the deformation plate mount 199 holds a cluster of ball bearings 203. The bearings 203 ride against the lower surface 205 of the lower mounting plate 189. Thus, the deformation plate mount 199 can shift in position with respect to the lower mounting plate 189 in an amount determined by the oversize of the apertures 195 to the cross-sectional dimension of the shoulder screws 197.

Horizontal stability is provided for the deformation plate mount 199 by plungers 207 held in horizontal bore holes 208 in lower extending portions 209 of the periphery of the lower mounting plate 189. The plungers 207 mate with notches 211 in the periphery of the deformation plate mount 199.

A deformation plate 213 is mounted to the bottom surface 215 of the deformation plate mount 199, such as with screws 217.

Figure 7:
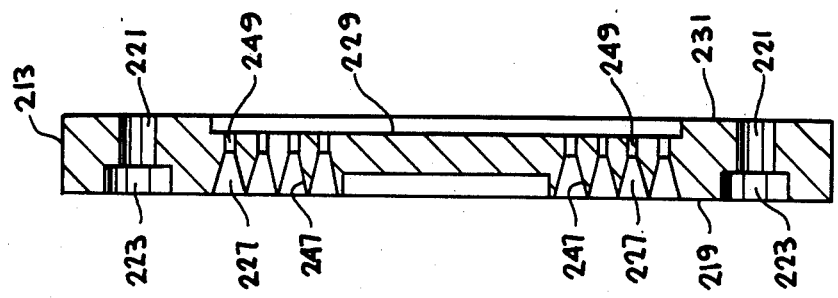
FIG. 7 is a cut-away plan view (side) taken in plane A—A of the exemplary deformation plate as shown in FIG. 6.
Figure 6:
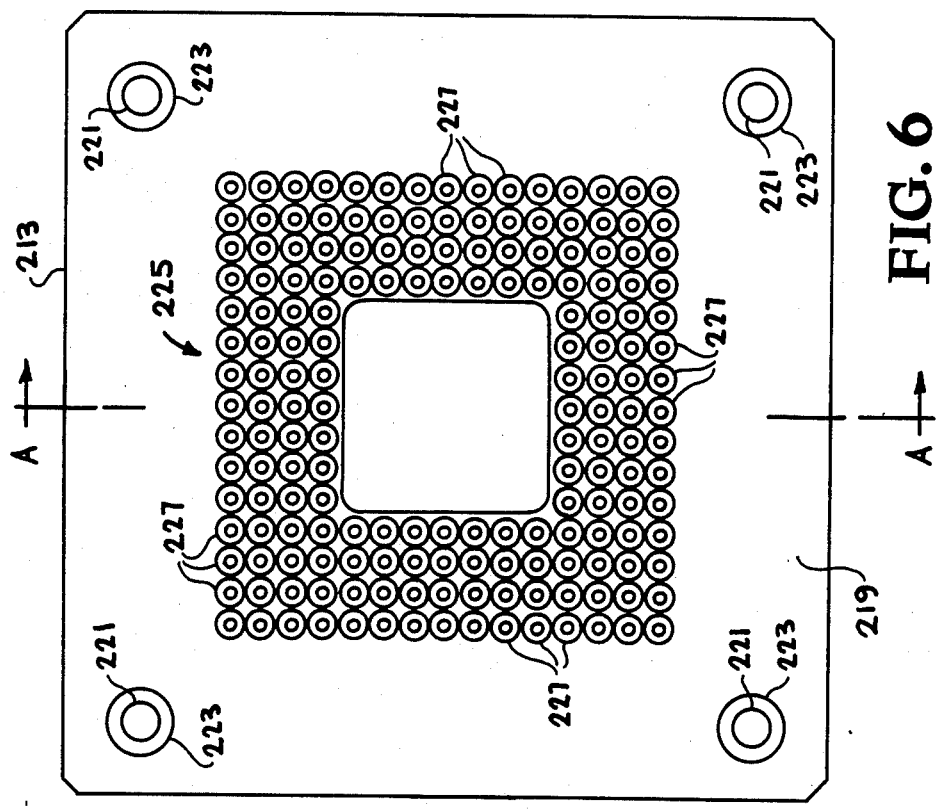
FIG. 6 is a plan view (top) of an exemplary deformation plate used in the present invention as shown in FIG. 3.

FIGS. 6 and 7 show an exemplary deformation plate 213 for straightening the pins on a typical 144 pin gate array mount as shown in FIG. 2. The deformation plate 213 has a planar surface 219. Four apertures 221 are provided for the mounting screws 217, having recesses 223 at the surface 219 for recessing the screw head below the surface 219. Thus, full abutment of the deformation plate planar surface 219 to the surface 6 of the package 3 is ensured.

An array 225 of inverted funnel-shaped apertures 227 extend from the surface 219 to a central recess area 229 of the back-side 231 of the deformation plate 213. The significance of the particular shape of the apertures 227 will be explained in relation to the operation of the apparatus 100.

In order to provide a rough alignment between an integrated circuit mounting package 3 on the turntable 105 and the deformation plate 213, a centering mechanism is provided. At each station where the deformation plate 213 will be used, the shoulder piece 119 has an aperture 233. A plunger holder 235 abuts the outer periphery 237 of the shoulder piece 119 and has a bore hole 239 aligned with the aperture 233 in the shoulder piece 119. A plunger 241 is resiliently held in said bore hole 239 due to its protruding extremity 243 being in contact with the outer rim 125 of the turntable 105. The outer rim 125 is provided with a centering notch 245 for each depression 115.

Among other applications (to which, as will be recognized by those skilled in the art, minor modifications would make the present invention useful), the apparatus 100 is useful for performing a method of straightening the electrical connector pins 4 of an integrated circuit mounting package 3. As will also be apparent to those skilled in the art, the operation of the apparatus can be manual or automated.

A mounting package 3 is loaded into one of the depressions 115 in the upper surface 117 of the turntable 105 at a position where the turntable outer rim 125 is clear of the shoulder piece 119, such as designated in FIG. 4 by the arrow labelled number 1. As depicted in FIG. 5, the electrical connector pins 4 of the package 3 are generally pointing in an upward vector direction when the package is fit snugly into the depression 115.

The turntable then rotates, as indicated by the arrow labelled number 2, until the notch 245 in the turntable outer rim 125 mates with the protruding extremity 243' (not shown) of the plunger 241' (not shown) at the first deformation station. Note, that with proper dimensioning the mating of the protruding extremity 243 of the plunger 241 with one of the notches 245 occurs simultaneously at the second deformation station. The shoulder piece 119 serves to prevent centrifugal force from shifting the package 3 from its fixed position once inserted into depression 115. To prevent any interference with the rotational motion of the turntable 105, the piston 177 holds the deformation plate surface 219 a suitable height above the turntable surface 117 and the ends of the pins 4.

Once the package 3 is positioned at the first deformation station, as indicated by the arrow labelled 4, the transport 175 lowers the deformation plate 219 (and its mounting apparatus as described). The pins 4 enter the roughly aligned funnel apertures 227 of the deformation plate 213 at their widest cross-sectional area at the plate surface 219. As the deformation plate 219 is progressively lowered, pins 4—particularly bent pins—will contact the inner walls 247 of the funnel apertures 227.

Since the deformation plate mount 199 is in a "floating" contact with lower mounting plate 189, viz., with the interstitial ball bearings 203, contact between the pins 4 and the aperture inner walls 247 will cause the deformation plate mount to shift in accordance with the pressure each exerts against the other. As more and more pins make such contact, more minute adjustments in the relative relationship of the deformation plate 213 and the package 3 are made. Hence, the effect is a self-alignment of the deformation plate 213 to the package. Furthermore, as the deformation plate 213 reaches the limits of its travel, as determined by the oversize of apertures 195 to the screws 197, the same forces will begin to bend the pins 4. The funnel shape thus bends the pins 4 more and more toward a specific vector direction. This specific vector direction is determined by the angle of the spout hole 249 which acts as a socket at the apex of the funnel relative to the deformation plate surface 219.

The downward motion of the deformation plate assembly continues until the deformation plate surface 219 abuts the package bottom 6. The central recess 229 in the surface 231 of the deformation plate 213 prevents the pins 4 from being damaged by contact with the lower surface 215 of the deformation plate mount 199.

Once the downward motion of the deformation plate assembly is complete, the transport mechanism 175 is reversed and the piston 177 retracts the deformation plate assembly.

Once the deformation plate carrier is fully raised by the piston 177, the turntable 105 continues its rotation until the package 3 reaches a second deformation station, as indicated in FIG. 4 by the arrow labelled number 5. The deformation process is then repeated.

The two deformation plate stations are used in order to use the principle of controlled deformation. The deformation plate at the first deformation station has its apertures with spout hole 249 bored to move all pins 4 on a diagonal outward from the center of the deformation plate 213. For example, a typical pin has a cross-section diameter of approximately 0.020 inch with a spacing on the package bottom 6 of approximately 0.100 inch. The funnel mouth has a cross-section diameter of approximately 0.050 inch. The spout is pointed in an outward vector to deform each of the pins 0.005 inch. This outward diagonal thus makes provision for any elastic spring-back action of the pins.

At the second deformation station, the apertures are arranged to reverse the outward deformation by deforming the pins inwardly, i.e., opposite the direction of the first deformation. Again, this inward diagonal makes provision for any elastic spring-back action of the pins. After the second deformation, all of the pins will be within approximately ±0.010 inch of true vertical from the package bottom 6.

The foregoing description of the preferred embodiment of the present invention has been presented for purposes of illustration and description. It is not intended to be exhaustive or to limit the invention to the precise form disclosed. Obviously, many modifica tions and variations will be apparent to practitioners skilled in this art. The embodiment was chosen and described in order to best explain the principles of the invention, and its practical application, to thereby enable others skilled in the art to understand the invention for various embodiments and with various modifications as are suited to the particular use contemplated. It is intended that the scope of the invention be defined by the claims appended hereto and their equivalents.

What is claimed is:

1. A method for straightening a plurality of electrical connector pins on a base of an integrated circuit mounting package, said method comprising the steps of:
    mating at a first straightening station said mounting package with a first deformation plate having first shaped apertures to deform said pins on a diagonal outward from the center of said first deformation plate into which said pins are inserted;
    rotating said mounting package from the first straightening station to a second straightening station which is located orthogonally to said first straightening station; and
    mating at said second straightening station said mounting package with a second deformation plate having second shaped apertures to deform said pins on a diagonal inward to the center of said second deformation plate into which said pins are inserted, thereby aligning said pins to be substantially perpendicular to the base of said mounting package.

2. An apparatus for simultaneously straightening a plurality of connector pins on a surface of an integrated circuit mounting package comprising:
    turntable means having a series of radially-aligned depressions for fixedly holding said package in a position such that said pins project in a substantially upward vertical direction;
    said turntable means being rotatably mounted on a platform surface for moving said package from a first straightening station to a second straightening station, said first and second straightening stations being orthogonally located on the platform surface;
    a first deformation plate disposed at said first straightening station and having a plurality of first apertures with central axes in substantially downward vertical direction in substantially like arrangement to said plurality of connector pins when said package is moved into said first straightening station;
    said first apertures having a first spout hole bored to move said plurality of pins on a diagonal outward from the center of said first deformation plate;
    first transport means disposed at said first straightening station for moving said first deformation plate toward and away from said package such that said pins are inerted into said first apertures and thereafter into said first holes, whereby said pins are conformed to an outward deformation;
    a second deformation plate disposed at said second straightening station and having a plurality of second apertures with central axes in substantially downward vertical direction in substantially like arrangement to said plurality of connector pins when said package is moved into said second straightening station;
    said second apertures having a second spout hole bored to move said plurality of pins on a diagonal inward to the center of said second deformation plate; and
    second transport means disposed at said second straightening station for moving said second deformation plate toward and away from said package such that said pins are inserted into said second apertures and thereafter into said second holes, whereby said pins are conformed to an inward deformation and are thereby aligned substantially perpendicular to the surface of said package.

3. An apparatus as claimed in claim 2, further comprising movable mounting means located at said first and second straightening stations for holding said respective first and second deformation plates in a substantially horizontal plane above said turntable means and said package, said movable mounting means having alignment adjustment means for allowing horizontal shifting of said respective first and second deformation plates.

4. An apparatus as claimed in claim 3, wherein each of said movable mounting means located at said first and second straightening stations further comprises:
    a first mounting plate being fastened to said first and second transport means;
    a second mounting plate being loosely fastened to said first mounting plate;
    said respective first and second deformation plates being mounted to a bottom surface of said second mounting plate; and
    an array of hard-material balls interstitially held between said first and second mounting plates such that said second mounting plate can be shifted horizontally with respect to said first mounting plate.

* * * * *